United States Patent [19]
Tomioka et al.

[11] Patent Number: 5,385,115
[45] Date of Patent: Jan. 31, 1995

[54] SEMICONDUCTOR WAFER HEAT TREATMENT METHOD

[75] Inventors: Junsuke Tomioka; Tetsuro Akagi, both of Hiratsuka; Shiro Yoshino, Sagamihara, all of Japan

[73] Assignee: Komatsu Electronic Metals Co., Ltd., Japan

[21] Appl. No.: 30,356

[22] PCT Filed: Sep. 20, 1991

[86] PCT No.: PCT/JP91/01259
§ 371 Date: Mar. 17, 1993
§ 102(e) Date: Mar. 17, 1993

[87] PCT Pub. No.: WO92/05579
PCT Pub. Date: Apr. 2, 1992

[30] Foreign Application Priority Data
Sep. 21, 1990 [JP] Japan .................. 2-250226

[51] Int. Cl.$^6$ .............................................. C30B 1/02
[52] U.S. Cl. ........................................ 117/2; 117/13; 117/930; 437/10
[58] Field of Search ............ 156/603, 620.4, DIG. 64, 156/DIG. 73; 437/10; 117/2, 13, 930

[56] References Cited

U.S. PATENT DOCUMENTS

| | | | |
|---|---|---|---|
| 4,140,570 | 2/1979 | Voltmer et al. | 156/626.4 |
| 4,193,783 | 3/1980 | Matsushita | 156/DIG. 73 |
| 4,220,483 | 9/1980 | Cazcarra | 437/10 |
| 4,376,657 | 3/1983 | Nagasawa et al. | 437/10 |
| 4,622,082 | 11/1986 | Dyson et al. | 437/10 |
| 5,066,599 | 11/1991 | Kaneta et al. | 437/10 |
| 5,096,839 | 3/1992 | Amai et al. | 437/10 |

FOREIGN PATENT DOCUMENTS

| | | |
|---|---|---|
| 0008661 | 3/1980 | European Pat. Off. |
| 0020993 | 1/1981 | European Pat. Off. |
| 0030457 | 6/1981 | European Pat. Off. |
| 0165364 | 12/1985 | European Pat. Off. |
| 58-30137 | 2/1983 | Japan |
| 56-80139 | 7/1987 | Japan |

OTHER PUBLICATIONS

R. Swaroop et al, *Testing for Oxygen Precipitation in Silicon Wafers*, Solid State Technology, vol. 3, Mar. 1987, pp. 85–89.

*Primary Examiner*—Robert Kunemund
*Attorney, Agent, or Firm*—Welsh & Katz, Ltd.

[57] ABSTRACT

A semiconductor wafer heat treatment method for improving the yield of devices which are end products by sampling sliced single-crystal silicon wafers made by CZ method to previously calculate the thermal donor concentration of each portion on the wafers and providing them with the IG heat treatment process which causes oxygen precipitation nucleus under the heat treatment condition determined according to the thermal donor concentration so that the change value (delta Oi) of the initial oxygen concentration (initial Oi) before the IG heat treatment to the oxygen concentration after the heat treatment will be kept within a predetermined range.

7 Claims, 10 Drawing Sheets

SEMICONDUCTOR WAFER HEAT TREATMENT METHOD

TECHNICAL FIELD

The present invention relates to a heat treatment method of semiconductor wafers, particularly a wafer obtained by slicing a silicon single crystal produced by a pulling method, and more particularly to a technique for controlling the precipitation amount of oxygen in the wafer by changing the conditions of "heat treatment causing oxygen precipitation nucleus" (hereinafter referred to as the IG heat treatment) in correspondence to quantity of thermal donors in the crystal directly after being pulled.

BACKGROUND ART

In producing a silicon single crystal, for example, by a pulling method, since a crucible for containing melt of a material is usually made of quartz, oxygen of about $10 \times 10^{17} - 20 \times 10^{17}$ atoms/cc (old ASTM) is taken into the pulled crystal. During the fabrication of a device, the oxygen taken into the crystal is supersaturated and precipitated by heat treatment, thereby to create micro defects in the crystal. Such defects caused by the precipitation of oxygen can be a gettering site of impurities. Gettering which utilizes the defects caused by oxygen precipitation is called intrinsic gettering (hereinafter referred to as IG) which is widely used as one of clean gettering methods. In of clean gettering methods. In order to fully exhibit the advantageous effect of IG, precise control of the amount of the oxygen precipitation is required. In actuality, however, the amount of oxygen precipitation by heat treatment usually vary according to the thermal history of the crystal in the course of the pulling process.

The behavior of such precipitation of oxygen in a silicon wafer is described, for example, in ASTM Task Force Committee Report "Testing for Oxygen Precipitation in Silicon Wafers", Solid State Technology/-March 1987, p. 85.

This report shows the conditions of heat treatment for silicon wafers having various initial interstitial oxygen concentrations (hereafter referred to as initial Oi) such as 1,050° C. for 16 hours, or 750° C. for 4 hours and then 1,050° C. for 16 hours (see Table 1 for the conditions). In the report, heat treatment was performed in accordance with the heat treatment conditions of Table 1, and the difference of interstitial oxygen concentrations (hereinafter referred to as delta Oi) before the heat treatment (initial Oi) and after the heat treatment was measured. The result of the measurement is shown in FIGS. 6 and 7.

TABLE 1

| | |
|---|---|
| 1 | 1,050° C. for 16 hrs |
| 2 | 750° C. for 4 hrs + 1,050° C. for 16 hrs |
| 3 | 800° C. for 4 hrs + 1,000° C. for 16 hrs |
| 4 | 900° C. for 4 hrs + 1,000° C. for 16 hrs |
| 5 | 1,000° C. for 16 hrs |

The heat treatment shown in Table 1 has been conventionally used as simple heat treatment conditions (hereinafter referred to as simulation heat treatment) for examining the amount of oxygen precipitation. FIG. 8 shows the yield of devices with respect to delta Oi as a result the simulation heat treatment. To ensure that the delta Oi falls within a hatched portion of FIG. 8, that is, in a range where the yield of device is not adversely effected, a plurality of wafers having substantially the same initial Oi is subjected to IG heat treatment at 650° C. for 60 minutes as is performed conventionally. However, the delta Oi varies from wafer to wafer, and cannot always fall within the range. In the average, the delta Oi draws a S-curve with respect to the initial Oi, but the variance is large.

It is therefore an object of the present invention to reduce variance of the delta Oi in the device manufacturing process into a desired range of the delta Oi with high controllability so as to improve the yield of the devices.

DISCLOSURE OF THE INVENTION

A part of oxygen taken into a crystal by the pulling method becomes donors in the crystal according to the thermal history during the pulling operation. This is called thermal donors. The results of various experiments exhibit that the thermal donors facilitate the creation of oxygen precipitation defects in the crystal and that a change (delta Oi) before the IG heat treatment of the initial Oi and after the IG heat treatment greatly varies according to the thermal donor concentration in the crystal.

The present invention has been made in view of this fact, and is characterized in that a wafer is subjected to IG heat treatment under heat treatment conditions determined according to the thermal donor concentration in the crystal directly after being pulled, thereby to cause the change (delta Oi) after the heat treatment relative to the initial Oi before thermal treatment to fall within a desired range.

The thermal donor concentration is measured as follows.

A thermal donor is produced when a part of oxygen taken into the crystal becomes a donor according to the thermal history in the pulling process. Meanwhile, the resistivity of the crystal is determined by impurities such as phosphorus and boron which are added to the crystal beforehand. Since the resistivity of the crystal is changed according to the concentration of the thermal donors generated in the crystal, the thermal donor concentration can be determined by measuring the resistivity of the crystal. The thermal donors is eliminated by heat treatment at about 650° C. for about 30 minutes. Accordingly, the thermal donor concentration in a crystal directly after being pulled can be measured by measuring the resistivity of the crystal directly after being pulled, measuring the resistivity of the crystal after the donor eliminating process at about 650° C. for about 30 minutes and calculating the difference between the resistivities of the crystal before and after the heat treatment of the donor eliminating process. In other words, the difference between the resistivities before and after the donor elimination can be considered to correspond to the thermal donor concentration.

In order to make uniform the oxygen precipitation amount, i.e., delta Oi in wafers after the device manufacturing process, the present invention provides IG heat treatment conditions, i.e., heat treatment conditions determined according to the thermal donor concentration, which are to be employed in place of the conventional conditions so as to cause the variance of the delta Oi during the device manufacturing process to fall within a desired range with high controllability and hence improve the yield of the devices.

Especially, for a crystal having high thermal donor concentrations in which the same temperature conditions of the IG heat treatment are used, higher controllability is achieved by performing short-time IG heat treatment on the crystal. The IG heat treatment conditions comprise temperature condition and time condition. When the temperature is changed, the delta Oi is likely to be changed due to other factors. Accordingly, control is easier by changing the time alone.

In actual operations, wafers are prepared by slicing the respective portions having different thermal donor concentrations of a silicon single crystal manufactured by Czochralski method, and the relation between the IG heat treatment conditions (temperature and time conditions) and the oxygen precipitation amount delta Oi after simulation heat treatment is obtained. By using the relation, IG heat treatment conditions under which a target oxygen precipitation amount is given to a wafer are determined.

In the implementation of the present invention, the resistivities, before and after the IG heat treatment, of wafers taken out from respective portions of a silicon single crystal produced by Czochralski method are converted to dopant concentrations using ASTM (F723-82), and the thermal donor concentration is calculated from the difference between these dopant concentrations. An n-type single crystal is used. Namely, thermal donor concentration $=5\times 10^{15} ((1/\rho_1)-(1/\rho_2))$ where $\rho_1$ is resistivity of wafer before IG heat treatment;
$\rho_2$ is resistivity of wafer after IG heat treatment.

For a wafer whose initial Oi is $15.5\times 10^{17}$ atoms/cc–$16.5\times 10^{17}$ atoms/cc, the relationship between thermal donor concentration and the oxygen precipitation amount delta Oi after each simulation heat treatment is shown in FIGS. 5a–5c. It turned out that the higher the thermal donor concentration is in the single crystal when pulled up, the larger the oxygen precipitation amount becomes.

For different silicon wafers having the initial oxygen concentration of a substantially constant value of $6.0\times 10^{17}$ atoms/cc and quantity of thermal donors of $0.1\times 10^{15}$ atoms/cc–$1.6\times 10^{15}$ atoms/cc, the IG heat treatment is conducted in which temperature and time are changed between 500° and 700° C. and between 1 and 8 hours, respectively. Thereafter, the wafers are subjected to different simulation heat treatments as follows:

(Heat treatment A)
800° C.×4 hours in $N_2$+1,000° C.×16 hours in dry $O_2$
(Heat treatment B)
900° C.×4 hours in $N_2$+1,000° C.×16 hours in dry $O_2$
(Heat treatment C)
1,000° C.×16 hours in dry $O_2$ FIGS. 3(a)–(f) show the oxygen precipitation amounts for respective conditions.

It can be seen from FIGS. 3(a)–(f) that in order to equalize the delta Oi's, the IG heat treatment time of a wafer having relatively high thermal donor concentrations is required to be reduced when the heat treatment temperature is the same In contrast, when the heat treatment time is the same, the temperature is required to be reduced.

Therefore, from the graphs of FIGS. 3(a)–(f), IG heat treatment conditions (temperature, time) for optimizing the delta Oi for each portion of a silicon single crystal ingot whose quantity of thermal donors differs from each other. IG heat treatment using the conditions thus determined serves to equalize the oxygen precipitation amount of the single crystal and hence improve the yield of the devices.

BEST MODE FOR CARRYING OUT THE INVENTION

Embodiment of the present invention will be described below.

Embodiment 1

Figure 4:
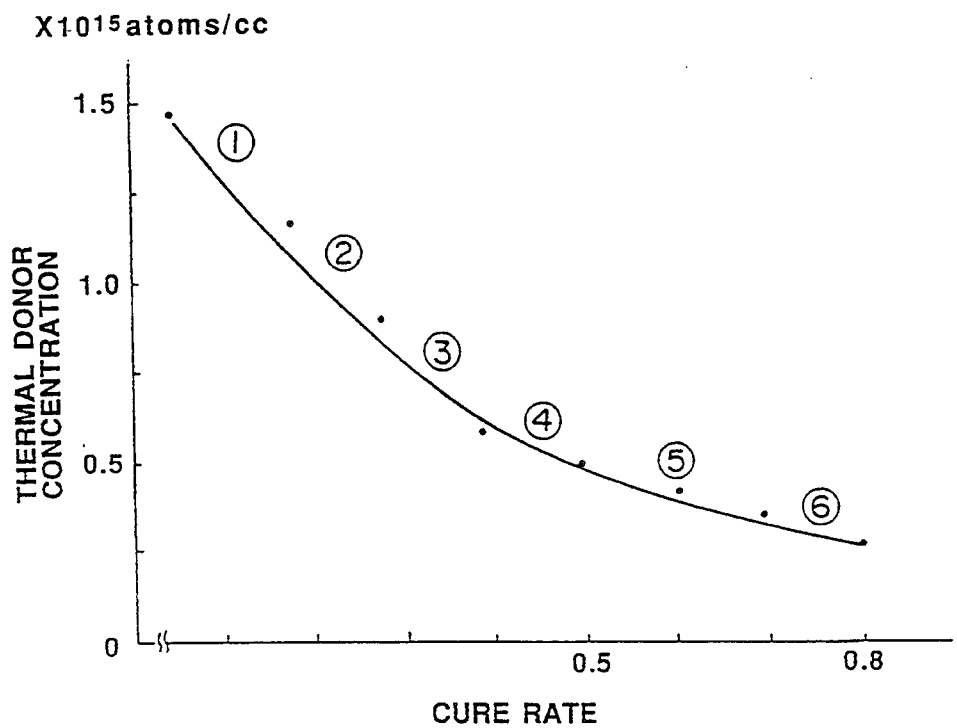
FIG. 4 is a graph illustrating thermal donor concentrations with respect to cure percentage of a single crystal.
Figure 5A:
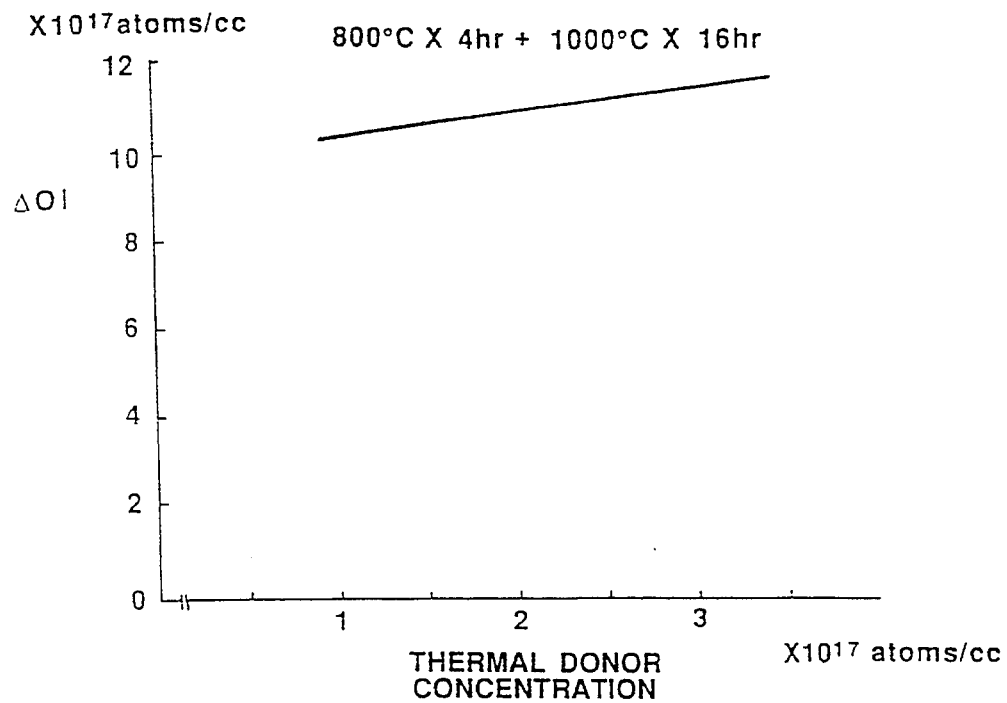
FIGS. 5(a)–(c) are graphs illustrating the relationship between thermal donor concentration and change delta Oi before and after the heat treatment.
Figure 5B:
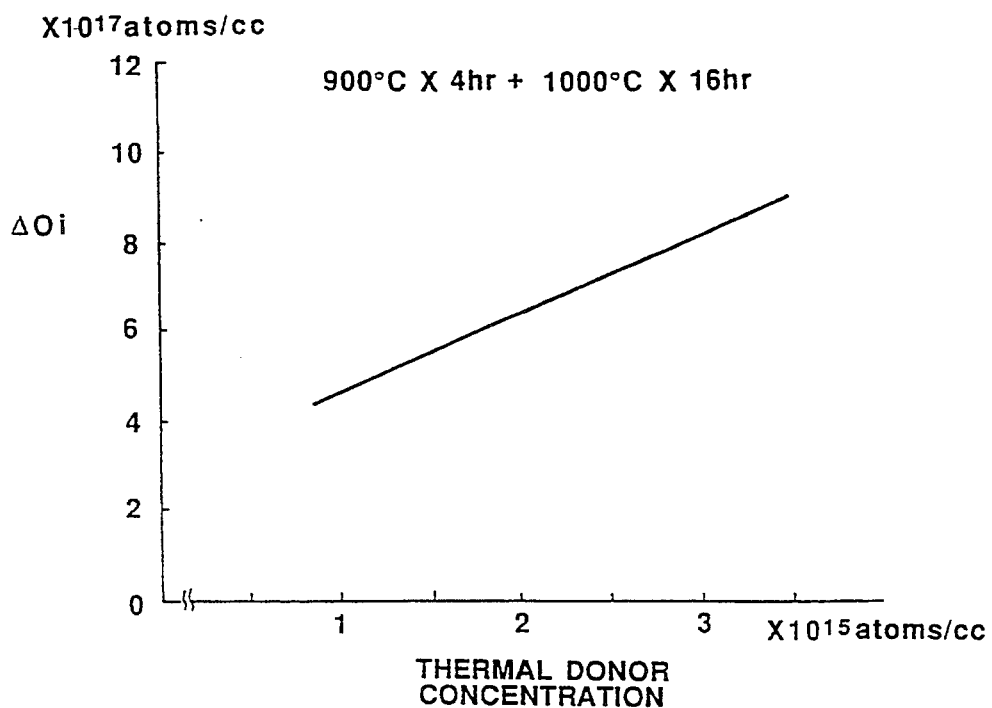
Figure 5C:
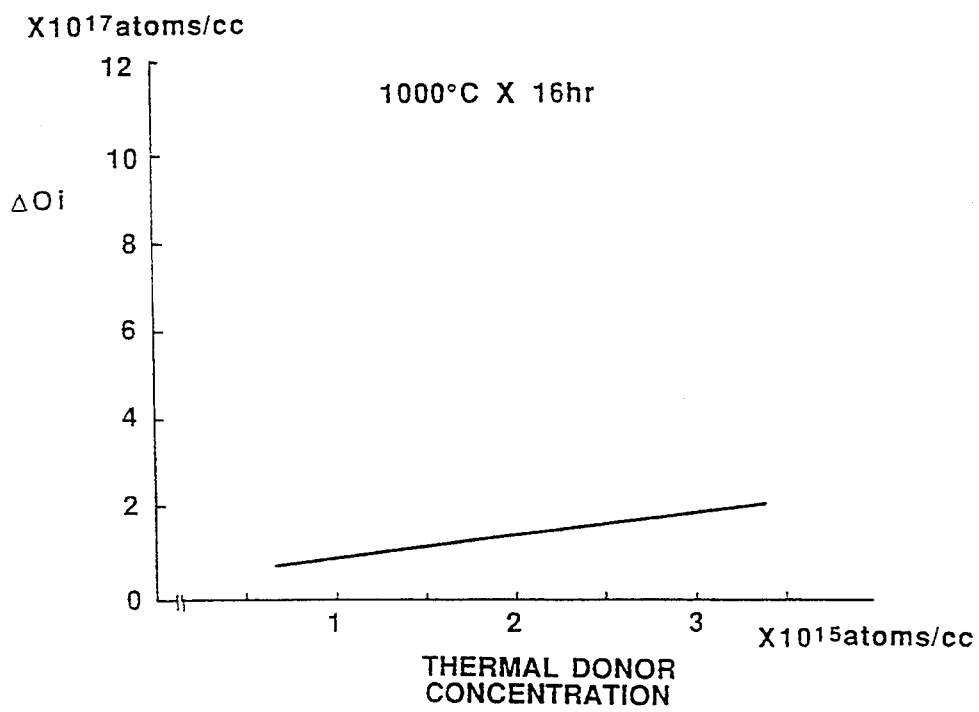
Figure 6:
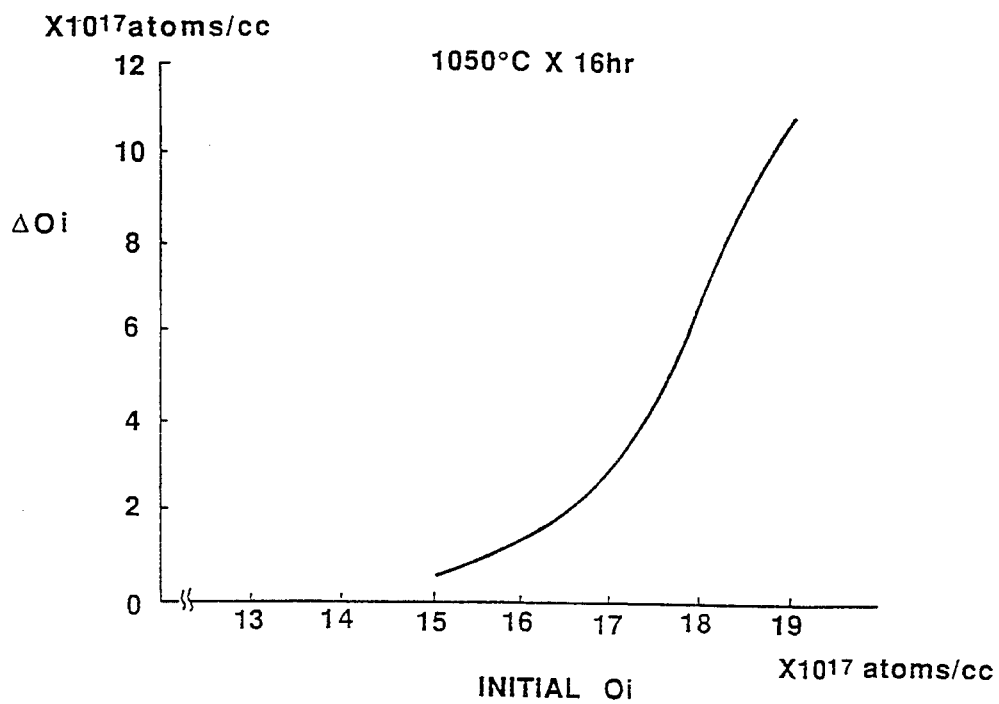
FIGS. 6 and 7 are graphs illustrating the relationship between the initial Oi and the change delta Oi before and after the heat treatment.
Figure 7:
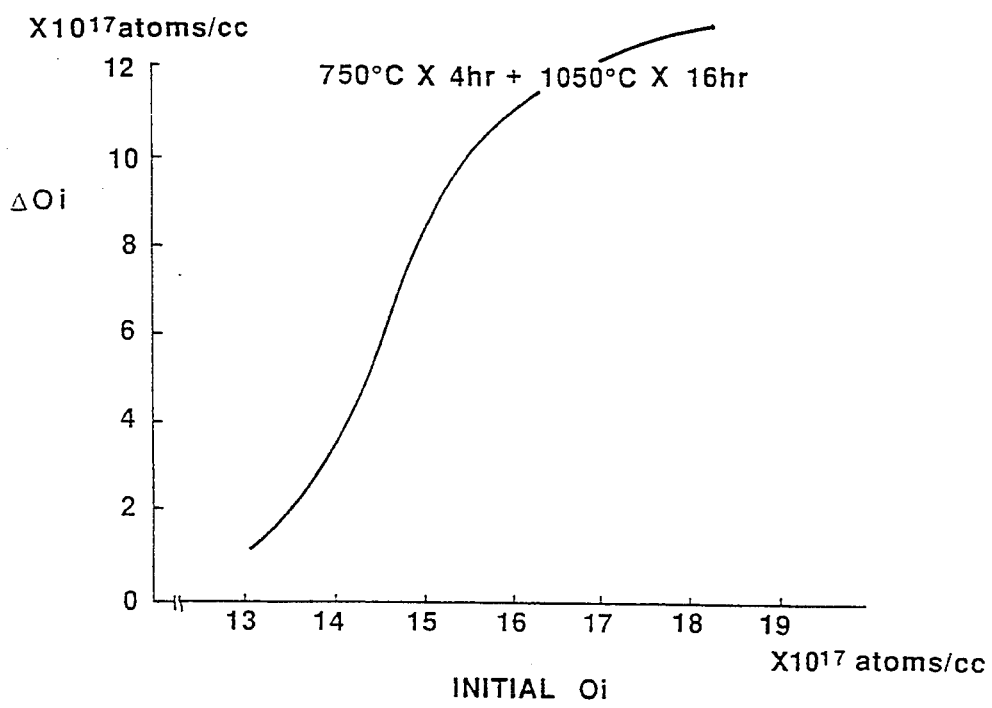
Figure 8:
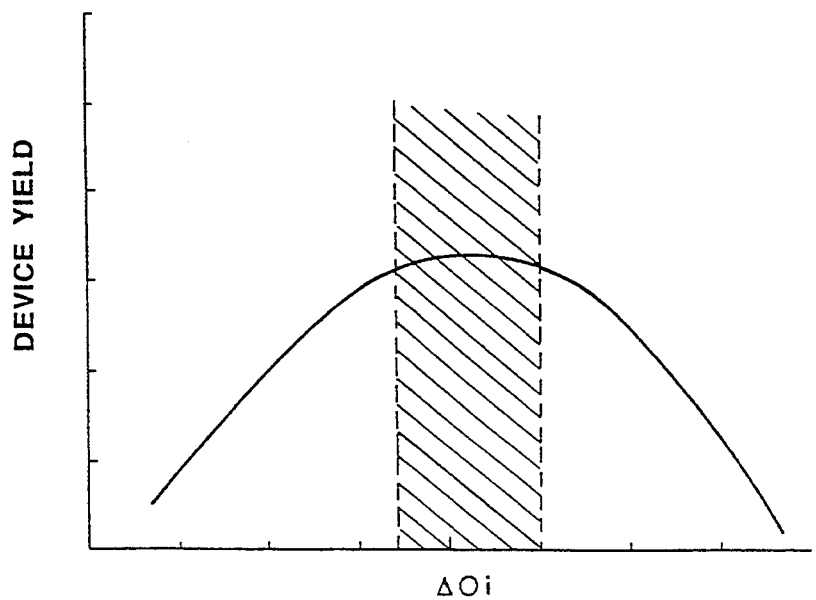
FIG. 8 is a graph illustrating the relationship between the change delta Oi and device yield.

The initial Oi in a silicon single crystal pulled by CZ method is approximately $(16\pm 0.5)\times 10^{17}$ atoms/cc and the thermal donor concentrations throughout the length of the pulled single crystal are as shown in FIG. 4. Table 2 shows the average values of the thermal donor concentrations for each block over the length of the single crystal.

TABLE 2

| Thermal donor concentration ($\times 10^{15}$ atoms/cc) | 1.3 | 1.0 | 0.7 | 0.4 | 0.3 | 0.2 |
|---|---|---|---|---|---|---|

When it is known that the optimal oxygen precipitation amount delta Oi for producing devices is more than $8\times 10^{17}$ atoms/cc after simulation heat treatment for heat treatment A; $4\times 10^{17}$–$6\times 10^{17}$ atoms/cc after simulation heat treatment for heat treatment B; and $3\times 10^{17}$ atoms/cc or less after heat after heat treatment for heat treatment C, the average thermal donor concentration from the top side of the single crystal to the respective blocks is as shown in Table 2. Therefore, by corresponding these values to the values in FIGS. 3(a)–(f), the optimal conditions for the IG heat treatment are obtained as shown in Table 3.

TABLE 3

| Temperature °C. | 625 | 625 | 625 | 625 | 625 | 625 |
|---|---|---|---|---|---|---|

TABLE 3-continued

| Time hour | 1.5 | 2.0 | 2.5 | 2.7 | 2.8 | 3.0 |
| --- | --- | --- | --- | --- | --- | --- |

Figure 1:
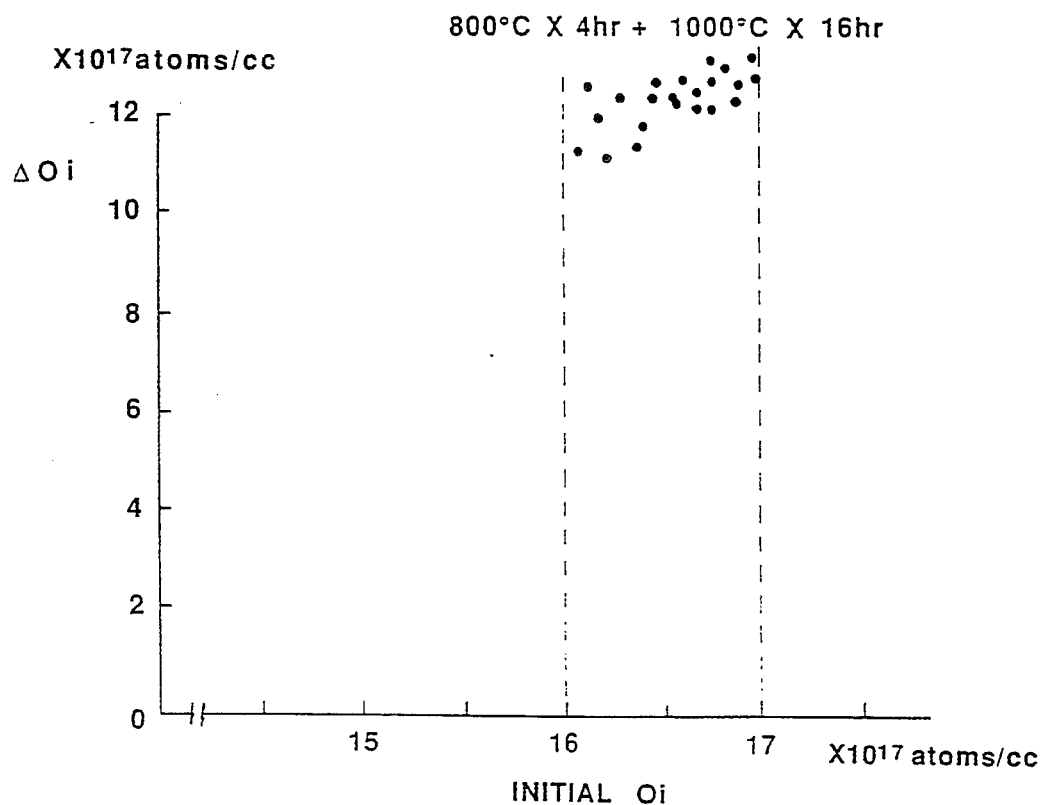
FIGS. 1(a)–(c) are graphs illustrating the relationship between the initial Oi and oxygen concentration change delta Oi before and after the heat treatment according to a method of the present invention.
Figure 1:
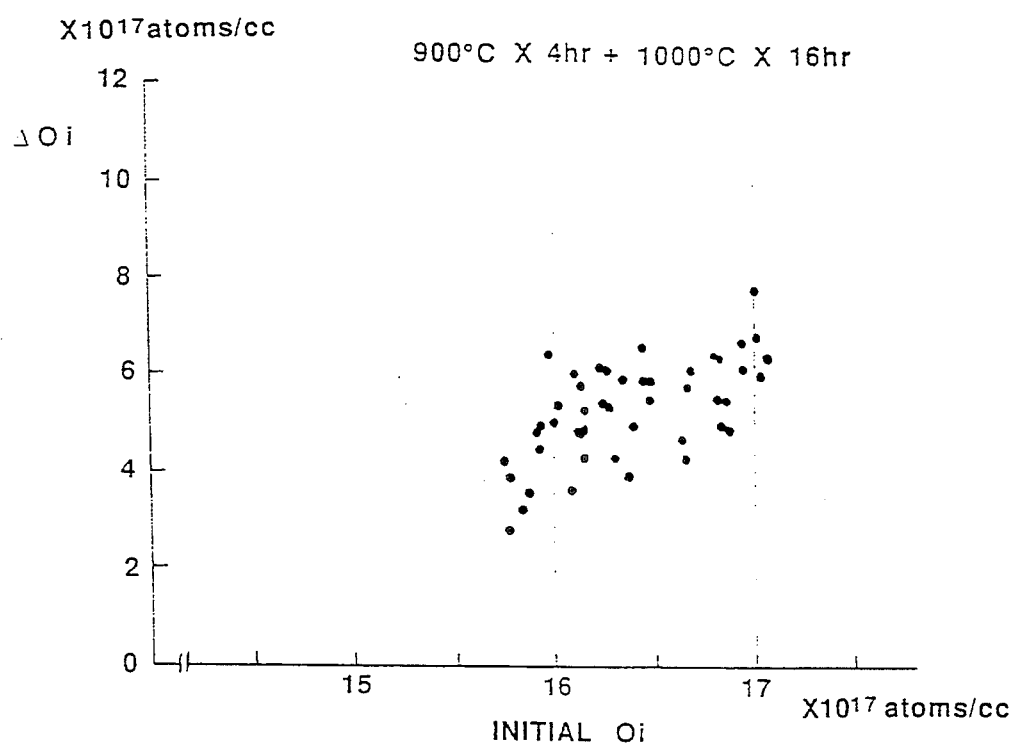
Figure 1C:
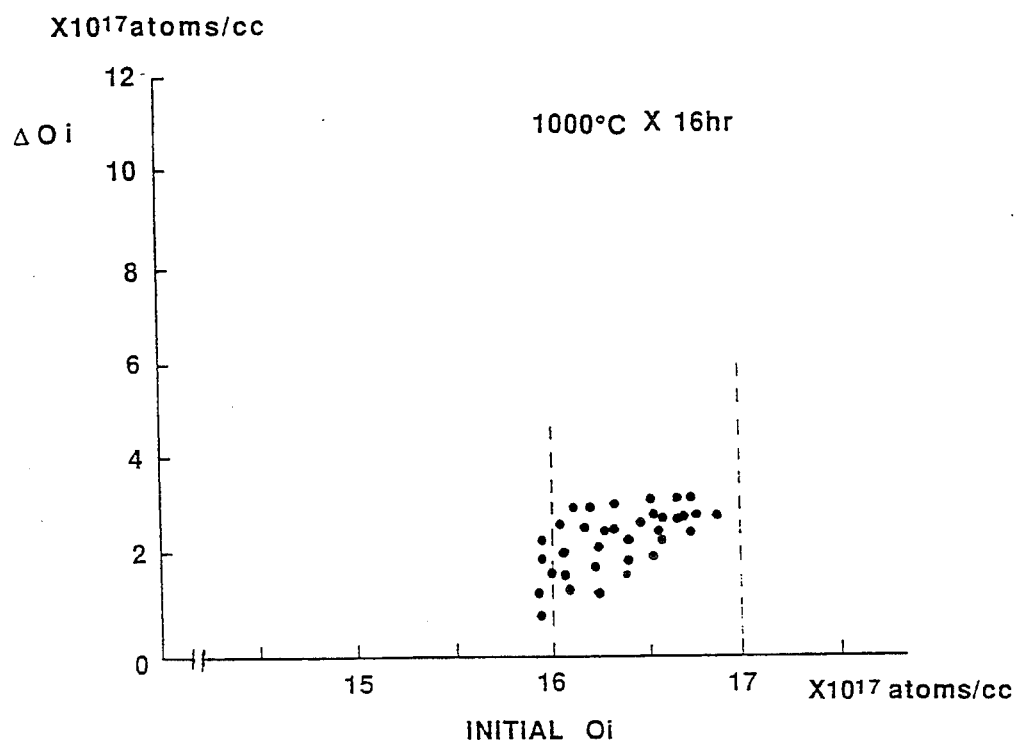

As a result of simulation heat treatment of the wafers cut out from the respective single crystal blocks which are subjected to IG heat treatment, the relationship between oxygen precipitation amount delta Oi and initial Oi in the wafer is as shown in FIGS. 1(a)–(c).

Figure 2A:
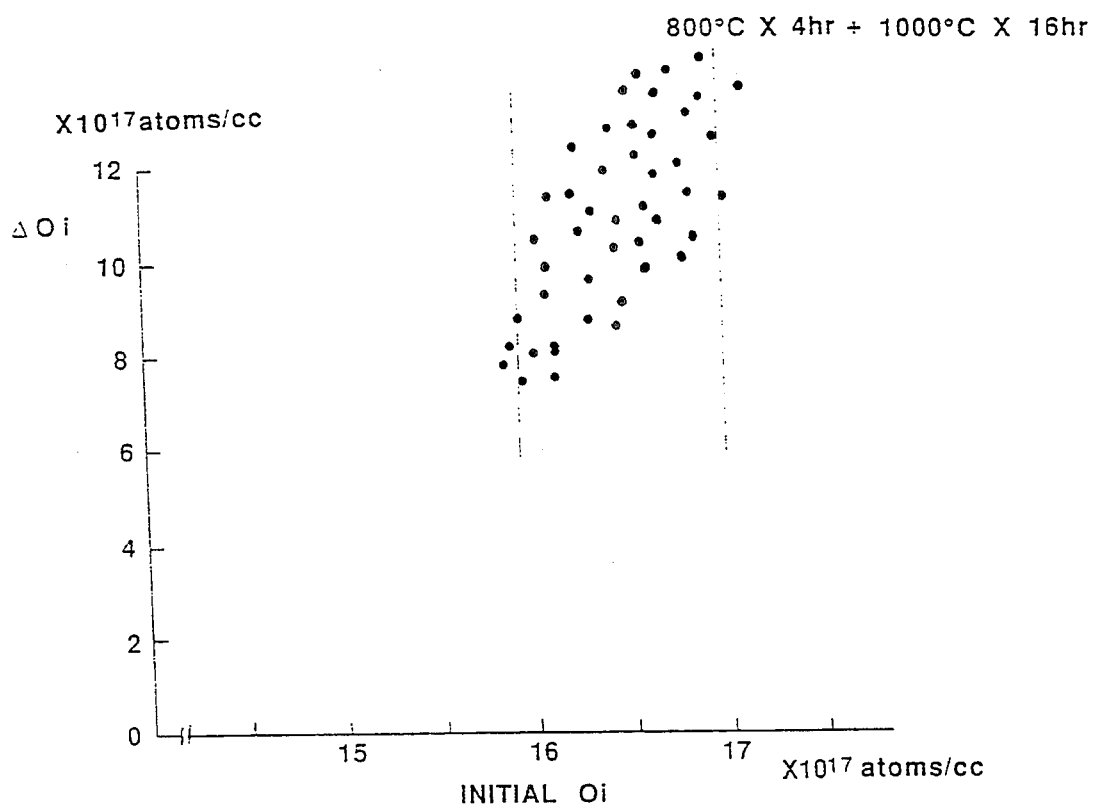
FIGS. 2(a)–(c) are graphs illustrating the relationship between the initial Oi and oxygen concentration change delta Oi before and after the heat treatment according to a conventional method.
Figure 2:
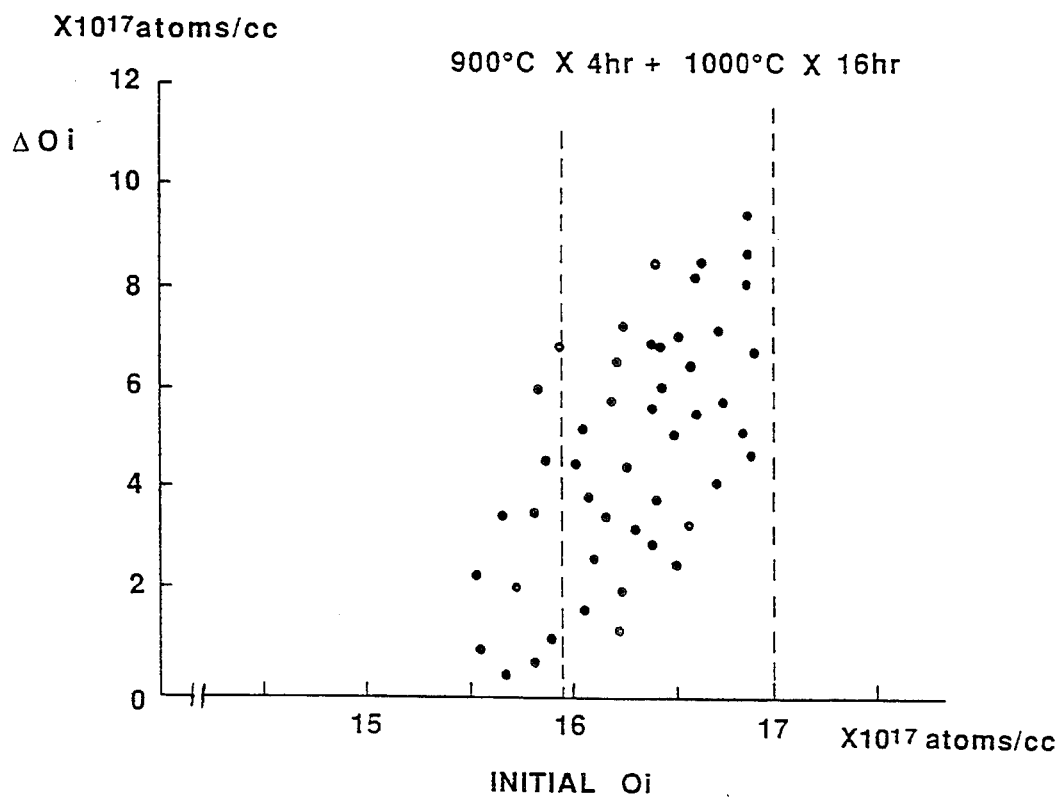
Figure 2:
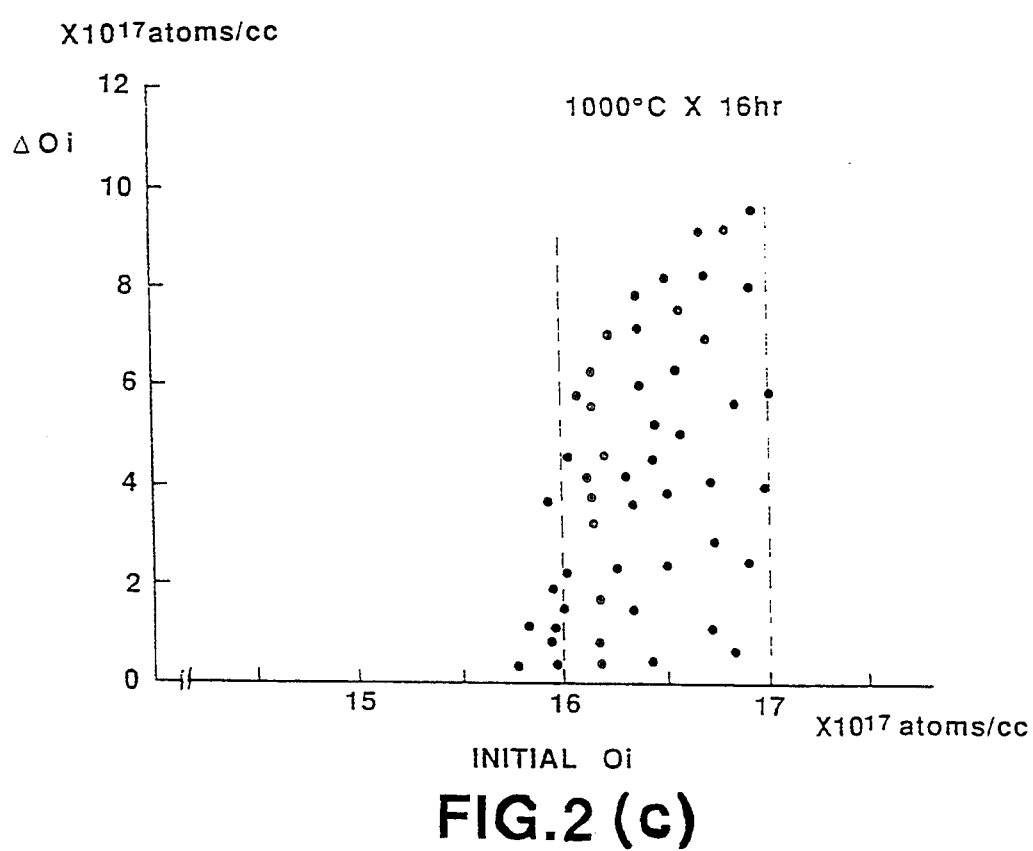
Figure 3:
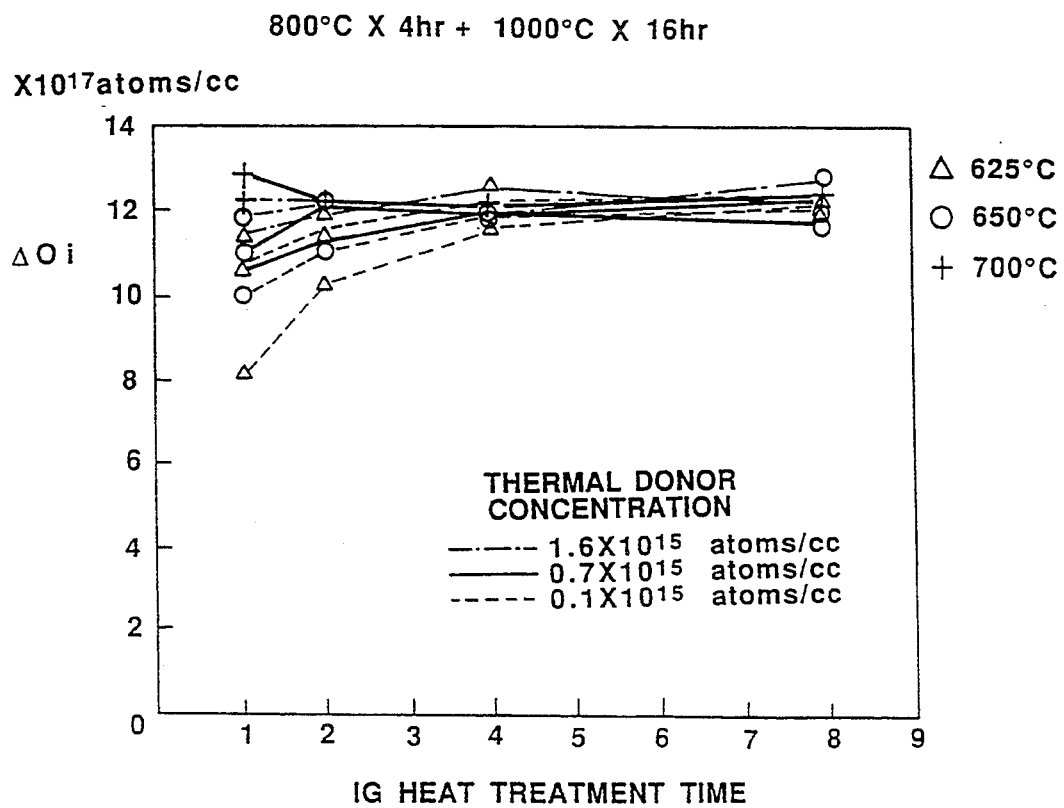
FIGS. 3(a)–(f) are graphs illustrating the relationship between heat treatment time causing oxygen precipitation nucleus and della Oi after simulation heat treatment.
Figure 3:
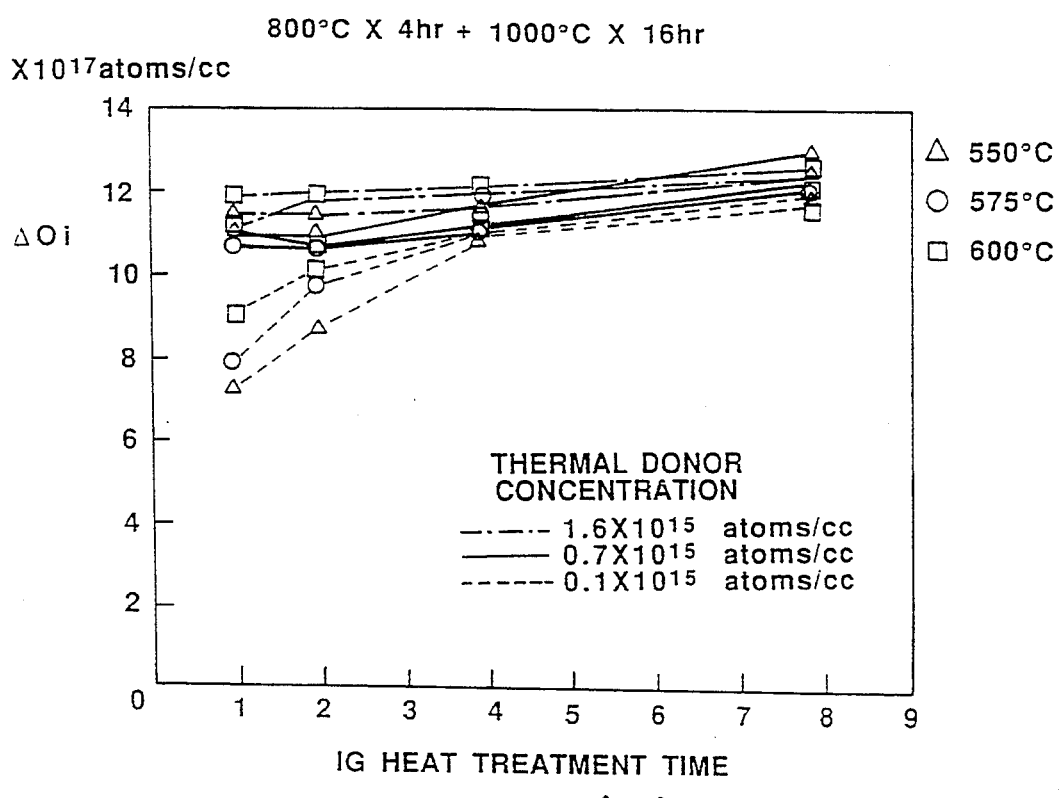
Figure 3C:
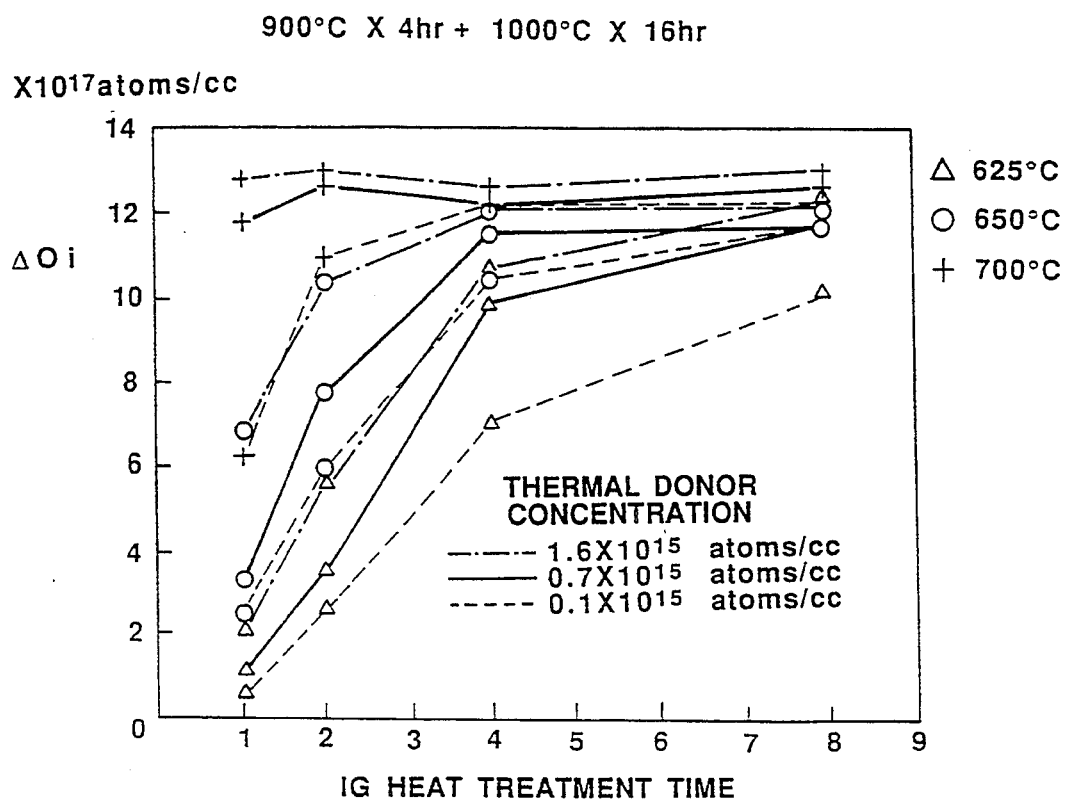
Figure 3D:
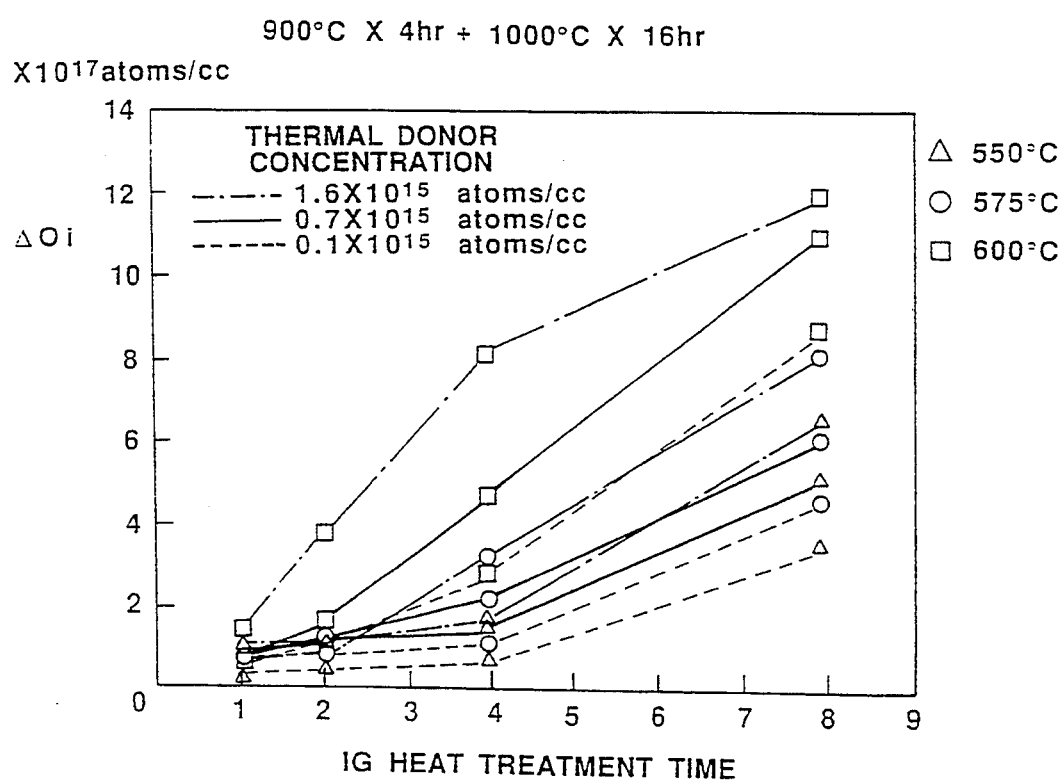
Figure 3E:
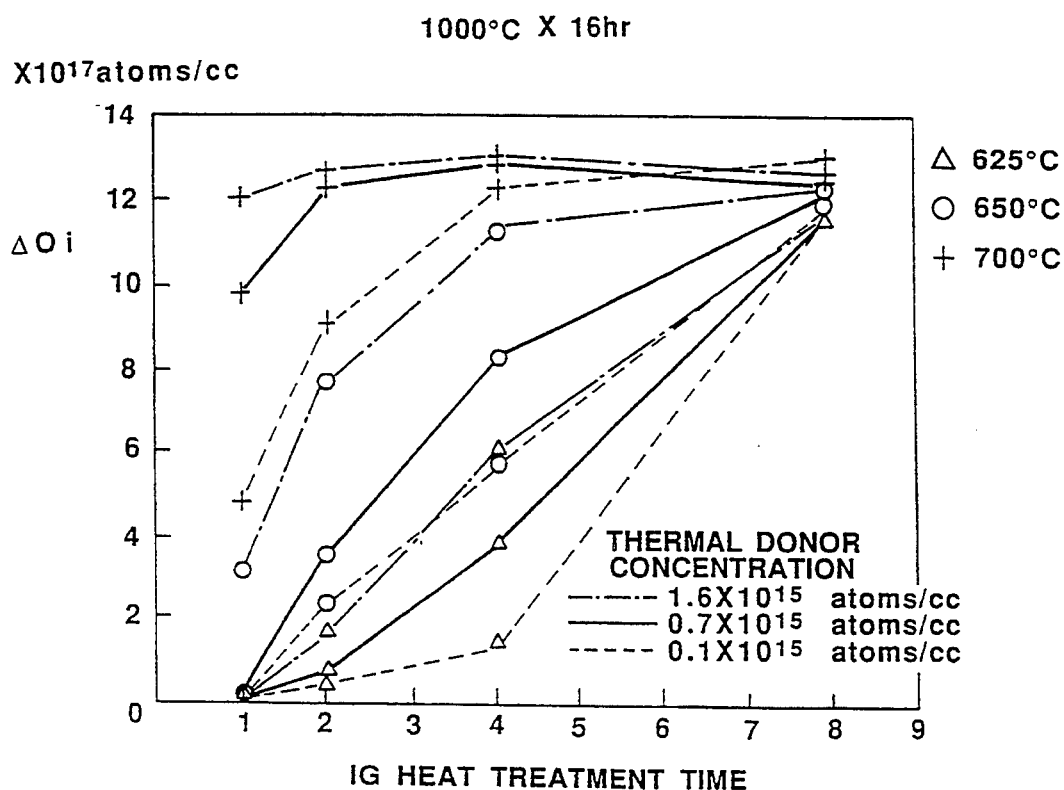
Figure 3F:
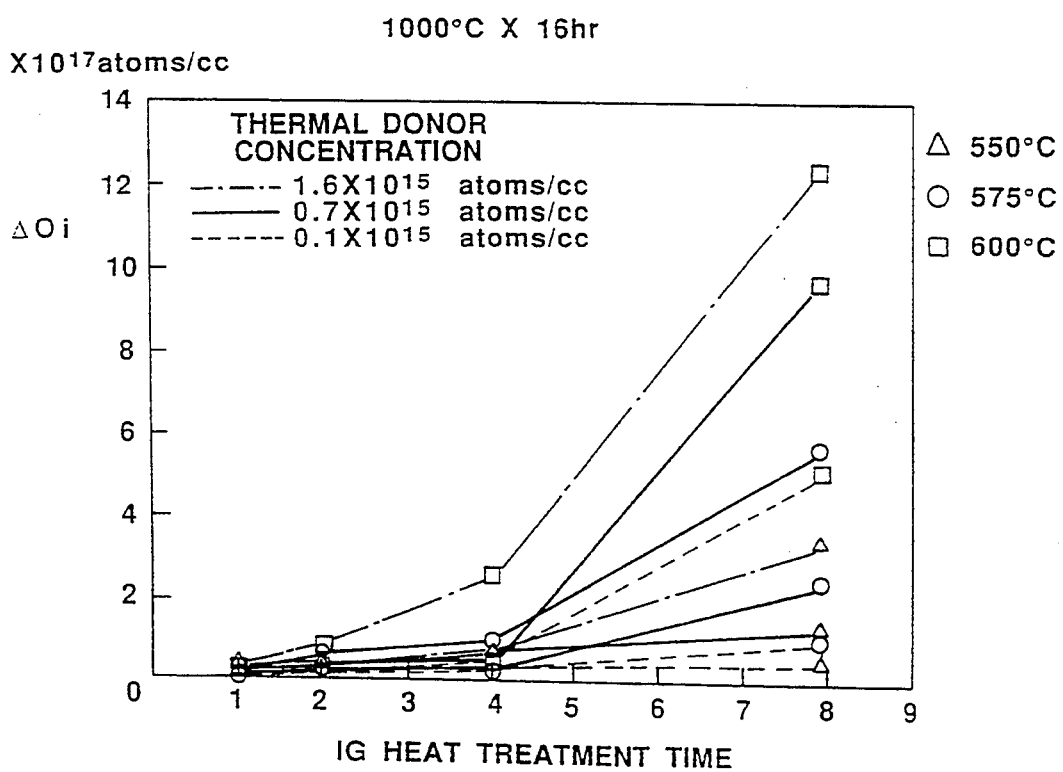

For comparing purposes, FIGS. 2(a)–(c) show the relationship between oxygen precipitation amount delta Oi and initial Oi in each of wafers which are uniformly subjected to conventional IG heat treatment at 650° C. for 2.5 hours.

The yield of devices using wafers produced by the method of this embodiment is improved by about 10% compared to devices using wafers produced in the conventional method.

As seen in this embodiment, by obtaining conditions and performing IG heat treatment according to the inventive method, the generation of varied amount of oxygen precipitation in the subsequent device manufacturing process is prevented and the yield of devices is improved.

According to the present invention, an IG heat treatment time (t) is determined from the following recurrence formula:

delta Oi = $\alpha$.initial Oi + $\beta$.thermal donor concentration + $\gamma$t + $\delta$ From a target oxygen precipitation amount delta Oi, the measured initial Oi and the thermal donor concentration, t = (delta Oi − $\alpha$.initial Oi − $\beta$.thermal donor concentration − $\delta$)/$\gamma$ When the IG heat treatment time for 650° C. is obtained:

delta Oi(800° C., 4 hrs +1,000° C., 16 hrs) = 2.09 × initial Oi + 0.237 × thermal donor concentration × 0.1547t − 23.177 R = 97.7%.

delta Oi(900° C., 4 hrs +1,000° C., 16 hrs) = 1.10 × initial Oi + 1,077 × thermal donor concentration + 2.04t − 16.87 R = 78.7%.

While in the above embodiment an IG effect causing oxygen precipitation during a low temperature heat treatment of about 650° C. is applied, a so-called 2-step IG which includes outward diffusion of oxygen by a high temperature (usually higher than 1,100° C.) heat treatment and subsequent a low temperature heat treatment is also applicable.

Figure 9:
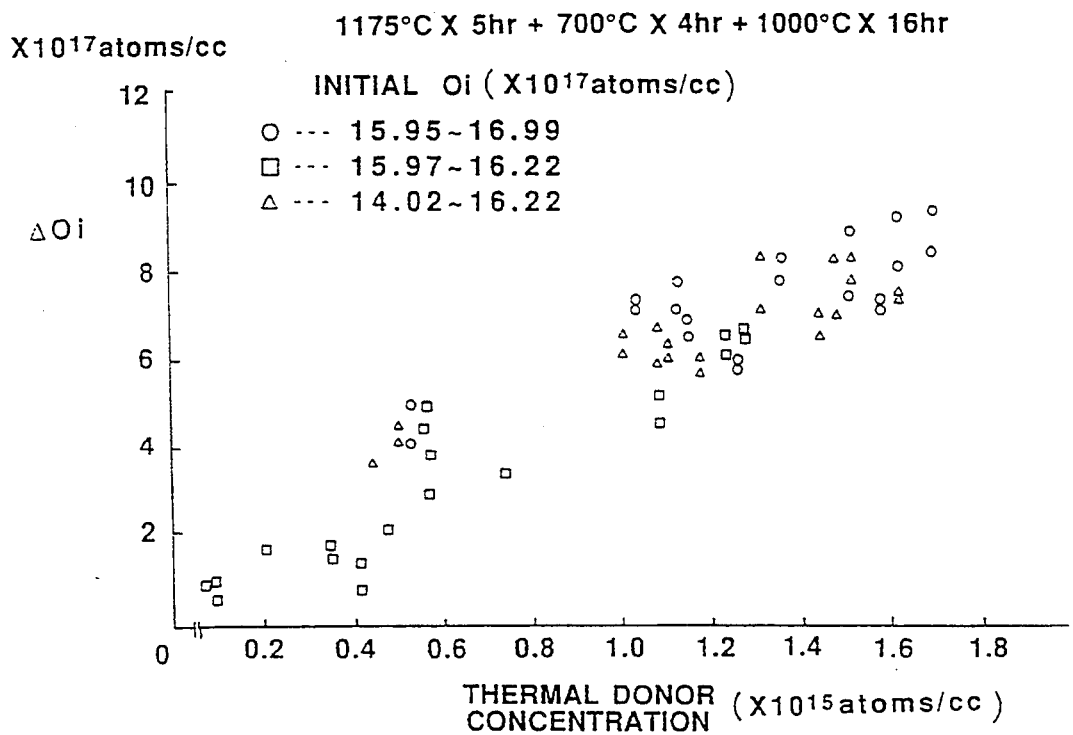
FIG. 9 is a graph illustrating the relationship between thermal donor concentration and the change delta Oi before and after the heat treatment.

FIG. 9 illustrates the relationship between the thermal donor concentration and oxygen precipitation amount in the case of a 2-step IG application in which a 2-step IG treatment at a higher temperature (1,175° C.) and a lower temperature (700° C.) is performed and then a simulation for heat treatment C is performed. In this case, a oxygen precipitation amount increases as the thermal donor concentration increases as in the former embodiment. In order to control the oxygen precipitation amount with high precision for a substrate having a high thermal donor concentration, a time for lower temperature heat treatment performed after high temperature heat treatment is required to be reduced even in the 2-stem IG. It is important that the conditions of the low temperature heat treatment should be calculated according to the concentration of the thermal donors in the same manner as described above.

INDUSTRIAL APPLICABILITY

In the present invention, the IG heat treatment is performed under the conditions determined according to the thermal donor concentration in the mulled crystal. Thus, variations in the target oxygen precipitation amount generated in the wafers in the device manufacturing process are reduced, and the yield of the devices which are end products is improved compared to the conventional uniform IG heat treatment. By doing so, efficiency of use of a single crystal ingot and hence productivity are improved.

We claim:

1. A method of performing heat treatment on a semiconductor wafer obtained by slicing a semiconductor single crystal grown from a melt contained in a quartz crucible by a pulling method, comprising the step of:

controlling the heat treatment on the semiconductor wafer by controlling conditions determined according to a thermal donor concentration in the semiconductor single crystal after being pulled said conditions including an interstitial oxygen concentration (Oi) such that a change ($\Delta$Oi) of the interstitial oxygen concentration (Oi) before and after heat treatment in device manufacturing process falls within a range so as to generate an oxygen precipitation nucleus in the wafer.

2. The method of claim 1, wherein the heat treatment step comprises the steps of:

calculating the thermal donor concentration of the pulled semiconductor single crystal on the basis of a change in the resistance value of the crystal before and after thermal treatment to eliminate the thermal donors in the semiconductor single crystal; and heating the wafer under the heat treatment conditions determined according to the thermal donor concentration.

3. The method of claim 1, wherein the concentration calculating step comprises the step of:

taking out a wafer from each portion of a single crystal ingot;

performing heat treatment on the wafer to eliminate thermal donors;

measuring change in the resistance value of the wafer before and after the heat treatment; and calculating a thermal donor concentration of each portion of the semiconductor single crystal after being pulled.

4. The method of claim 2, wherein the heating step comprises the step of:

changing heat treatment time such that the time is shorter for a wafer having a higher thermal donor concentration while heat treatment temperature is kept constant.

5. A method of performing heat treatment on a semiconductor wafer obtained by slicing a semiconductor single crystal grown from a melt contained in a quartz crucible by a pulling method, comprising:

a high temperature heat treatment step of heating the semiconductor wafer at a constant high temperature; and a low temperature heat treatment step of performing heat treatment on the wafer at a temperature lower than the temperature in the high temperature heat treatment step and under conditions determined according to a thermal donor concentration of the semiconductor single crystal after being pulled, said conditions including an interstitial oxygen concentration (oi) such that a change ($\Delta$Oi) of the interstitial oxygen concentration (Oi) before and after heat treatment in device manufacturing process generates an oxygen precipitation nucleus in the wafer.

6. The method of claim 5, wherein the low temperature heat treatment step comprises the steps of: calculating the thermal donor concentration of the pulled semiconductor single crystal on the basis of a change in the resistance value of the crystal before and after thermal treatment to eliminate the thermal donors in the semiconductor single crystal; and heating the wafer under the heat treatment conditions determined according to the thermal donor concentration.

7. The method of claim 6, wherein the heating step comprises the step of:

changing heat treatment time such that the time is shorter for a wafer having a higher thermal donor concentration while heat treatment temperature is kept constant.

* * * * *